United States Patent [19]

Skutta et al.

[11] Patent Number: 4,545,072

[45] Date of Patent: Oct. 1, 1985

[54] METHOD AND APPARATUS FOR ELIMINATING INTERFERENCE DUE TO SPURIOUS SIGNALS GENERATED IN SYNTHESIZED RECEIVERS

[75] Inventors: Frank R. Skutta, Palatine; Thomas R. Klaus, Hoffman Estates, both of Ill.

[73] Assignee: Motorola, Inc., Schaumburg, Ill.

[21] Appl. No.: 649,170

[22] Filed: Dec. 5, 1983

Related U.S. Application Data

[63] Continuation of Ser. No. 350,966, Feb. 22, 1982, abandoned.

[51] Int. Cl.$^4$ ............................................... H04B 1/26
[52] U.S. Cl. ............................... 455/183; 455/209; 455/260; 455/315; 455/317
[58] Field of Search ................ 455/76, 165, 183, 203, 455/207, 208, 209, 260, 265, 315, 316, 317, 302, 310

[56] References Cited

U.S. PATENT DOCUMENTS

| | | |
|---|---|---|
| 2,529,443 | 10/1945 | Bach . |
| 2,567,860 | 11/1946 | Shapiro . |
| 2,735,001 | 2/1956 | Witters . |
| 2,747,084 | 5/1956 | Doelz . |
| 2,998,517 | 8/1961 | Beckerich . |
| 3,372,339 | 3/1968 | Harrison et al. . |
| 4,198,604 | 4/1980 | Holdaway ........................... 455/260 |
| 4,259,644 | 3/1981 | Iimura .................................... 331/2 |
| 4,266,295 | 5/1981 | Bach, Jr. .............................. 455/158 |
| 4,267,605 | 5/1981 | Matsuzawa et al. ................. 455/266 |
| 4,300,237 | 11/1981 | Morgan ................................ 455/109 |

FOREIGN PATENT DOCUMENTS

| | | |
|---|---|---|
| 126256 | 4/1980 | Japan . |
| 12129 | 2/1981 | Japan .................................... 455/165 |
| 2067865 | 7/1981 | United Kingdom ................ 455/183 |

OTHER PUBLICATIONS

"A Portable All-Band Radio Receiver Using Microcomputer Controlled PLL Synthesizer", by Fukui et al., Aug. 1980.

"Synthesized Communications Receiver", article from Wireless World, Dec. of 1977, (New Products), vol. 83, No. 150.

(List continued on next page.)

Primary Examiner—Jin F. Ng
Attorney, Agent, or Firm—Rolland R. Hackbart; Edward M. Roney; James W. Gillman

[57] ABSTRACT

A synthesizer radio frequency (RF) signal receiver (FIG. 1) for single sideband radios is described that can eliminate interference due to internally generated spurious signals, commonly referred to as "whistler spurs". The unique receiver includes first and second mixers (102 and 106), which are intercoupled by a 75 mHz crystal filter (104) having a 20 kHz passband, and which are each coupled to signals from voltage controlled oscillators (120 and 140). The first IF frequency provided by the first mixer (102) varies about 75 mHz, and the second IF frequency provided by the second mixer (106) is fixed at 11.4 mHz. The second mixer (106) is coupled to 11.4 mHz stages (108) which have a 2.7 kHz passband. The 11.4 mHz stages (108) are followed by another mixer (110) and audio stages (112) for demodulating audio signals from the received RF signal, which are then applied to a speaker (114). The frequency of the VCO (120) coupled to the first mixer (102) can be varied by changing the divisor N of a programmable divider (123), and the frequency of the VCO (140) coupled to the second mixer (106) likewise can be varied by changing the divisor M of a programmable divider (133). When interference due to a whistler spur is present, activation of an IF pushbutton (160) enables a microcomputer (170), which changes divisors N and M for varying the frequencies of the two VCO's (120 and 140) by a multiple of 3.2 kHz, which in turn shifts the first IF frequency by 3.2 kHz. The frequency change also shifts the whistler spur outside of the 2.7 kHz passband of the 11.4 mHz stages (108) and greatly attenuates it. If the whistler spur is not sufficiently attenuated, the IF pushbutton (160) can be activated a second time.

12 Claims, 2 Drawing Figures

OTHER PUBLICATIONS

"The μP: The Key to An Advanced Frequency Synthesized HF SSB Amateur Radio Transceiver", by Robert Groth and Heath Zenith, from the IEEE Transactions on Consumer Electronics, vol. CE-26, Aug. of 1980, pp. 234 to 246.

"Is Land Mobile SSB", from COMMUNICATIONS, Jan. of 1982, pp. 94 to 97.

"MICOM-S HF-SSB Mobile/Fixed Radio", Motorola Manual, #R50-1.1-07, from Motorola Communications and Electronics Inc., 1981.

"HF-SSB MARINE SYSTEMS"—Long Distance Communications, (System Planner), Motorola Catalog #R4-2-20, Aug. 1981.

Semiconductor Data Update Mar./Apr. 1981—vol. 5, No. 11, CMOS PLL Frequency Synthesizers.

"MOTOROLA Semiconductors"—#MC38-70—Catalog No. AD1-445 R1, MOS-Single Chip Microcontroller, May 1981.

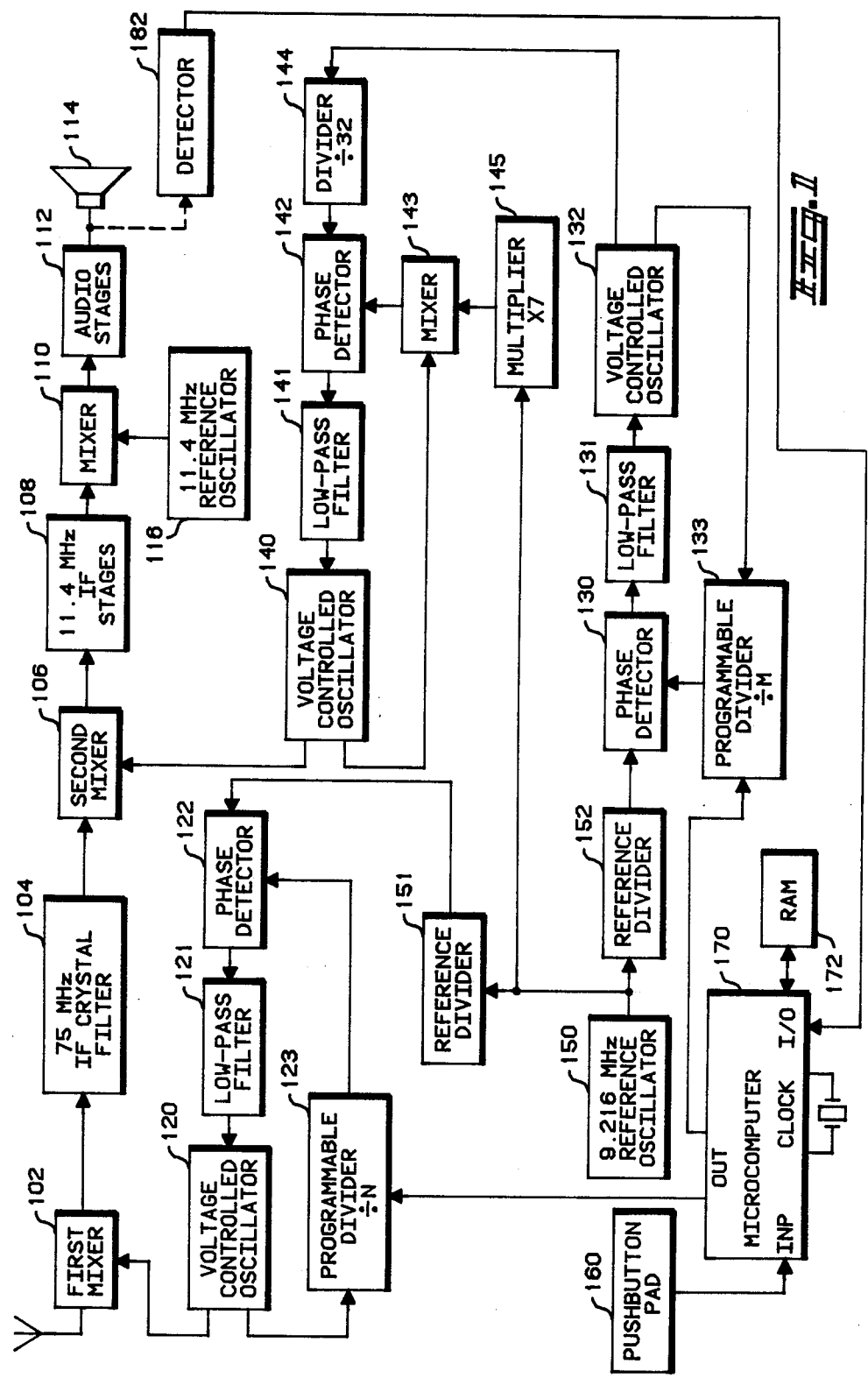

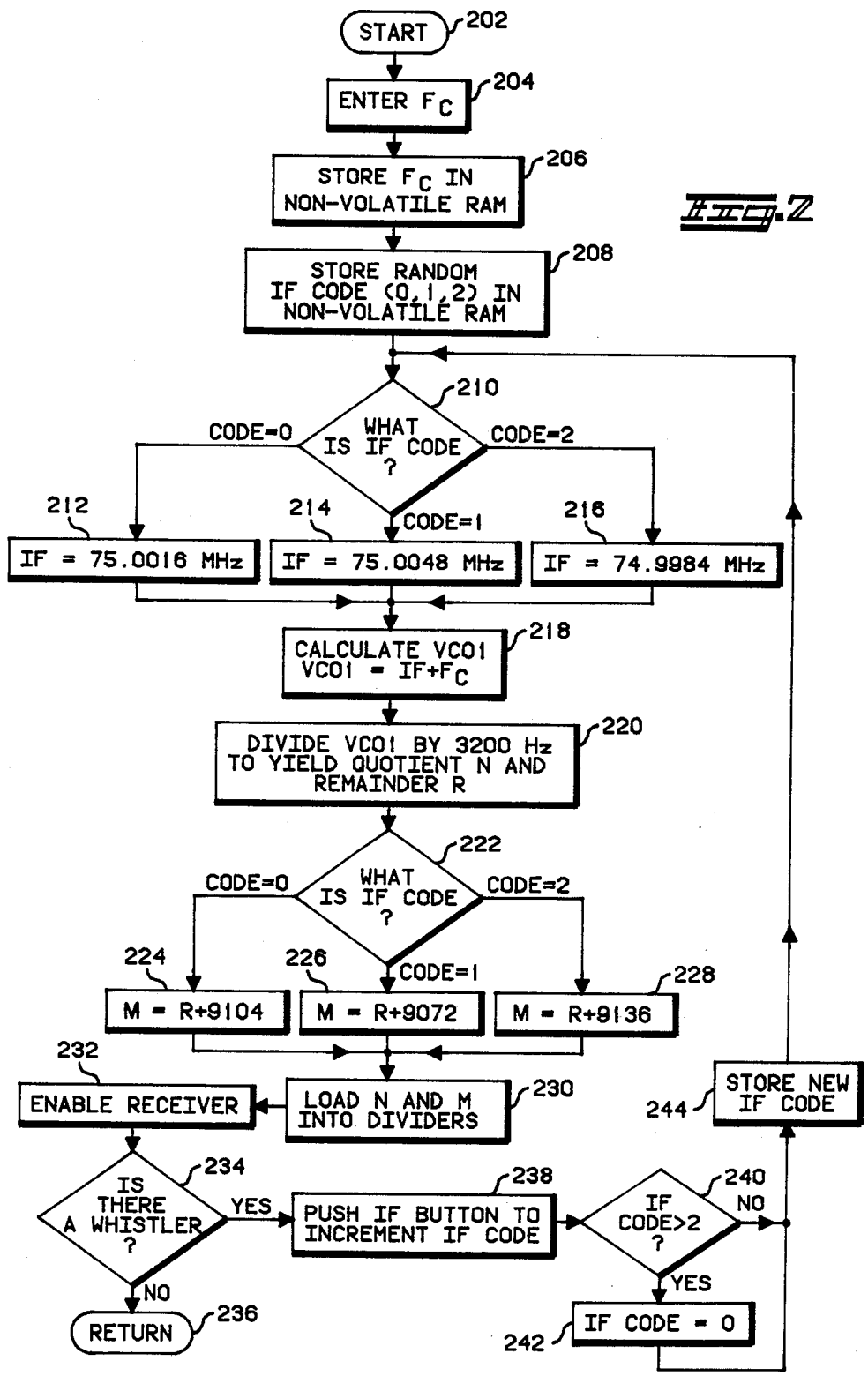

METHOD AND APPARATUS FOR ELIMINATING INTERFERENCE DUE TO SPURIOUS SIGNALS GENERATED IN SYNTHESIZED RECEIVERS

This is a continuation, of application Ser. No. 350,966, filed 2/22/82 now abandoned.

BACKGROUND OF THE INVENTION

The present invention is generally related to radio frequency (RF) signal receivers, and more particularly to an improved method and apparatus for eliminating interference due to spurious signals generated in synthesized RF signal receivers.

Conventional high frequency, synthesized, single sideband (SSB) receivers must be capable of receiving RF signals having frequencies at any possible multiple of 100 Hz between 2 mHz and 30 mHz. Since conventional SSB receivers may include one or more stages of signal multiplication, spurious signals, commonly referred to as "whistler spurs", can be generated which produce an audible tone at the output of the SSB receiver, making the particular RF signal frequency substantially unuseable.

The same phenomenon can occur in dual conversion, synthesized, frequency modulated (FM) receivers. In the case of such FM receivers, spurious signals, commonly referred to as "self quieters", cause the output of the FM receiver to be quieted (i.e. squelch opens) even though an RF signal is not being received. These self quieters also may render the particular RF signal frequency substantially unusable.

In the past, RF signal frequencies producing such whistler spurs or self quieters could not be used either because of the interference created or because of degradation of receiver performance requirements. This problem may be alleviated somewhat by selecting between two or more different intermediate frequency (IF) stages when the receiver is being manufactured. Assuming that the operating RF signal frequencies have been assigned to a particular reciever, the receiver sometimes can be manufactured with IF stage circuitry operating at a particular IF frequency that does not produce a whistler spur or self quieter on any of the assigned RF signal frequencies. For example, one of three different IF stages each having a different IF frequency can be selected to eliminate a whistler spur or self quieter. However, since the frequency of the IF stage is fixed during the manufacturing of the receiver, changes in the operating RF signal frequencies after manufacture can again produce a whistler spur or self quieter. Since it is very likely that the operating RF signal frequencies will be changed after manufacture of a receiver, selection between several different frequency IF stages during manufacture does not adequately solve the problem of whistler spurs and self quieters.

SUMMARY OF THE INVENTION

Accordingly, it is an object of the present invention to provide an improved method and apparatus for dynamically eliminating interference due to spurious signals generated in synthesized receivers.

It is another object of the present invention to provide an improved method and apparatus that may randomly select the IF frequency of a synthesized receiver.

It is yet another object of the present invention to provide an improved method and apparatus wherein the IF frequency of a synthesized receiver may be randomly assigned for each operating signal frequency.

It is yet a further object of the present invention to provide an improved method and apparatus wherein the IF frequency of a synthesized receiver may be stepwise or randomly changed in response to detection of a whistler spur or self quieter.

Briefly described, the present invention encompasses a radio frequency (RF) signal receiver that includes first and second stages of multiplication intercoupled by a first filter and followed by a second filter, a reference signal source, a synthesizer including circuitry responsive to a control signal for varying the frequency of first and second synthesizer signals by a pre-selected multiple of the reference signal, circuitry for generating an input signal indicating that spurious signal modulation is present, and control circuitry responsive to the input signal for generating the control signal in order to change the frequency of first and second synthesizer signals such that the spurious signal modulation, or whistler spur, is shifted outside the passband of the second filter. If interference due to the whistler spur is not completely eliminated, the frequency of the first and second synthesizer signals can be respeatedly changed until the interference is substantially eliminated. Thus, if a selected operating RF signal frequency produces a whistler spur, the inventive receiver may change the frequency of the first and second synthesizer signals until interference due to the whistler spur is substantially eliminated. As a result, all possible operating RF signal frequencies can be utilized since any interference due to whistler spurs can be eliminated by the receiver of the present invention.

BRIEF DESCRIPTION OF THE DRAWINGS

FIG. 1 is a block diagram of a synthesized SSB receiver embodying the present invention.

FIG. 2 is a detailed flow chart of a computer program for execution by microcomputer 170 in FIG. 1.

DETAILED DESCRIPTION OF THE PREFERRED EMBODIMENT

In FIG. 1, there is illustrated a block diagram of a synthesized SSB receiver embodying of the present invention. Although the present invention is described in conjunction with a synthesized SSB receiver, the present invention can be advantageously utilized in any synthesized RF signal receiver, including dual conversion, synthesized FM receivers. The SSB receiver in FIG. 1 includes two stages of mixing or multiplying 102 and 106 which are controlled by signals from voltage controlled oscillators (VCO's) 120 and 140, respectively. Mixers 102 and 106 are intercoupled by IF crystal filter 104, which has a 20 kHz passband centered about a frequency of 75 mHz. In order that the SSB receiver in FIG. 1 may operate at any RF signal frequency that is a multiple of 100 Hz between 2 mHz and 30 mHz, 3.2 kHz steps are generated by VCO 120 and 100 Hz steps are generated by VCO 140. That is, VCO 140 can take up to thirty-two 100 Hz steps in each 3.2 kHz step provided by VCO 120 for covering the possible operating RF signal frequencies.

VCO 120 is part of a phase-locked loop including low-pass filter 121, phase detector 122 and programmable divider 123. Phase detector 122 receives the output of programmable divider 123 and reference divider 151. Reference oscillator 150 generates a 9.216 mHz signal which is coupled to reference divider 151, multipler 145 and reference divider 152. Reference dividers 151 and 152 divide the 9.216 mHz reference signal by 2880 to generate a 3.2 kHz signal. All signal frequencies specified herein are exemplary of the preferred embodiment of the present invention, and may be any suitable signal frequencies depending on the electrical operating requirements of a particular synthesized receiver.

Programmable divider 123 in FIG. 1 is loaded with divisor N by microcomputer 170. Programmable divider 123, reference divider 151 and phase detector 122 may be provided by conventional integrated circuits, such as the Motorola type MC145144, MC145145, MC145146, MC145151, MC145152, MC145155 and MC145156 frequency synthesizers. The operating frequency of VCO 120, $F_{120}$, can be expressed by the following equation:

$$F_{120} = IF + F_c = 3200 \text{ N};$$

where $F_c$ is the operating RF signal frequency of the SSB receiver, IF is the first IF frequency, and N is the divisor of programmable divider 123. The first IF frequency varies to make sure that the frequency of VCO 120 is a multiple of 3200 Hz. For example, if the operating RF signal frequency of the SSB receiver is 2.7392 mHz and the first IF frequency is 74.9984 mHz, the divisor N of programmable divider 123 is 24293 and the frequency of VCO 120 is 77.7376 mHz. For the next higher operating RF signal frequency of 2.7393 mHz, divisor N is also 24293 but the first IF frequency is 74.9983 mHz.

VCO 140 in FIG. 1 is coupled to second mixer 106 for mixing the first IF frequency down to a second IF frequency of 11.4 mHz. Although the first IF frequency varies, the second IF frequency of 11.4 mHz remains the same for each different first IF frequency. The output from second mixer 106 is applied to IF stages 108 and thereafter to mixer 110 for combination with an 11.4 mHz reference signal from reference oscillator 116. IF stages 108 include amplifiers (not shown) and a bandpass filter (not shown) that has a 2.7 kHz passband centered about a frequency of 11.4 mHz. The output of mixer 110 is the recovered audio signal which is applied to audio stages 112 and thereafter to speaker 114. The audio demodulation circuitry may be any suitable conventional circuitry, such as that described in Motorola instruction manual numbers 68P81025E95 and 68P81026E05, available from the Service Publications Department of Motorola Inc., 1301 E. Algonquin Rd., Schaumburg, Ill.

When a whistler spur is present, an annoying audible tone is produced at the output of speaker 114. The whistling noise from speaker 114 may render that particular operating signal frequency essentially unuseable for voice communcations. In prior art SSB receivers, such an RF signal frequency was usually avoided since it could not be used for voice communications without the annoying intereference due to the whistler spur. However, by utilizing the present invention, the interference due to the whistler spur can be eliminated and the particular operating signal frequency can be utilized for voice communications free of any such interference.

VCO 140 is part of a phase-locked loop comprised of low-pass filter 141, phase detector 142 and mixer 143. Mixer 143 down converts the frequency of the output of VCO 140 by 64.512 mHz. Multiplier 145 multiplies the 9.216 mHz reference signal from reference oscillator 150 by factor of seven to provide an output having a frequency of 64.512 mHz. Phase detector 142 is coupled to mixer 143 and divider 144. The output of divider 144 is a signal which can be stepped in increments of 100 Hz for each unitary step of the divisor M of programmable divider 133.

Divider 144 is fed by the output of another phase-locked loop comprised of phase detector 130, low-pass filter 131, VCO 132 and programmable divider 133. Programmable divider 133, reference divider 152 and phase detector 130 can likewise be provided by the conventional frequency synthesizer integrated circuits listed hereinabove. When the divisor M of programmable divider 133 is changed by one, the output of VCO 132 is changed by 3.2 kHz and the output of divider 144 is changed by 100 Hz. Programmable divider 133 is loaded with the divisor M by microcomputer 170. For an operating RF signal frequency of 2.7392 mHz and a first IF frequency of 74.9984 mHz, programmable divider 133 is loaded with a divisor M of 9136, VCO 132 has a frequency of 29.2352 mHz, and VCO 140 has a frequency of 63.5984 mHz. For the next higher operating RF signal frequency of 2.7393 mHz and a first IF frequency of 74.9983 mHz, divisor M is 9137, VCO 132 has a frequency of 29.2384 mHz, and VCO 140 has a frequency of 63.5983 mHz.

The divisors N for programmable divider 123 and M for programmable divider 133 may be loaded into random-access memory (RAM) 172 from pushbutton pad 160 by microcomputer 170, or may be calculated by microcomputer 170 from stored operating RF signal frequencies. Microcomputer 170 may be any suitable conventional microcomputer, such as, for example, a Motorola type MC3870 single-chip microcontroller. These types of microcomputers usually include a read-only memory for storing a computer program. Pushbutton pad 160 may be any suitable conventional pad having alphanumeric pushbuttons. In the preferred embodiment of the present invention, pushbutton pad 160 includes numerical pushbuttons 0-9 and, an IF pushbutton and a number of other alphanumeric control pushbuttons.

Since the SSB receiver in FIG. 1 includes several signal multiplication and division stages, many spurious signals are internally generated which may combine with the output of VCO 120 in first mixer 120 to produce a whistler spur. The problem of whistler spurs is greatly magnified in any such synthesized radio. By utilizing the present invention, interference due to whistler spurs encountered on any selected operating RF signal frequency can be eliminated such that that particular operating RF signal frequency can be used for voice communications free of any interference.

In accordance with the present invention, interference due to a whistler spur can be eliminated by changing the frequency of both VCO 120 and VCO 140 and correspondingly shifting the first IF frequency to move the whistler spur outside of the 2.7 kHz passband of IF stages 108. The change in frequency of VCO's 120 and 140 is preferably made in steps of multiples of 3.2 kHz. Although 3.2 kHz steps are utilized in the SSB receiver in FIG. 1, any suitable increments in frequency can be utilized in practicing the present invention depending on the frequency of the outputs from reference dividers 151 and 152. Changing the frequency of VCO's 120 and 140 by 3.2 kHz shifts the first IF frequency up or down by 3.2 kHz, while keeping the second IF frequency constant at 11.4 mHz. Since all signal frequencies generated in phase-locked loops 120-123, 130-133 and 140-143 are likewise changed by each 3.2 kHz step, the spurious signals generated by harmonics of the internally generated signals likewise change, so that whistler spurs may be shifted outside of the 2.7 kHz passband of IF stages 108 and therefore greatly attenuated. The frequencies of VCO's 120 and 140 can be stepwise or randomly varied by different multiples of 3.2 kHz until a whistler spur has been shifted such that the whistling tone is sufficiently attenuated to be no longer present at speaker 114.

In the preferred embodiment of the present invention, the first IF frequency for each operating signal frequency is randomly chosen to be one of three different frequencies separated from one another by multiples of 3.2 kHz. If a whistler spur is detected by the operator of the SSB receiver, the IF pushbutton on pad 160 is activated to cause microcomputer 170 to select one of the other two possible first IF frequencies. If a whistler spur is still present, a second activation of the IF pushbutton on pad 160 will cause microcomputer 170 to select the remaining first IF frequency. For example, for an operating signal frequency of 2.7392 mHz and a first IF frequency of 74.9984 mHz, a 1.6 kHz whistler spur can be produced by the third harmonic, 2.7408 mHz, of the 913.6 kHz output of divider 144. Since the third harmonic is 1.6 kHz above the desired operating signal frequency of 2.7392 mHz, a 1.6 kHz tone is produced. Interference due to the 1.6 kHz whistler spur may be eliminated by shifting the frequency of VCO's 120 and 140 by 3.2 kHz, so that the first IF frequency is shifted to 75.0016 mHz. The 3.2 kHz frequency shift is obtained by shifting divisor N up by one from 24293 to 24294 and divisor M down by thirty-two from 9136 to 9104. Now, the third harmonic of the 910.4 kHz output of divider 144 is 2.7312 mHz, which is 8 kHz below the desired signal frequency of 2.7392 mHz. Since the passband of IF stages 108 is 2.7 kHz, the whistler spur, which is 8 kHz below the second IF frequency of 11.4 mHz, is outside the 2.7 kHz passband and therefore greatly attenuated by IF stages 108, such that interference due to the 8 kHz whistler spur is substantially eliminated.

According to another feature of the present invention, interference due to whistler spurs in the SSB receiver in FIG. 1 can be automatically eliminated by inclusion of whistler spur detector 182. Detector 182 may be a comparator, a sinad measuring device, or a tunable filter that scans the audio frequency band for energy. Detector 182 is coupled to the recovered audio signal from audio stages 112 and generates a binary one state if the recovered audio signal contains a whistler spur. Microcomputer 170 may be coupled to the output of detector 182 and may change the first IF frequency in response to a binary one state of the output of detector 182. Thus, instead of requiring the operator of the SSB receiver to push the IF pushbutton on pad 160 when a whistler spur is present, the presence of most whistler spurs can be automatically detected by means of detector 182. However, some whistler spurs that are audible to the human ear may not be detected by detector 182 since they have a relatively low voltage level. For this reason, use of the IF pushbutton on pad 160 may be preferable over detector 182, since an operator of the SSB receiver may wish to eliminate low-level whistler spurs that he considers to be annoying.

Referring to FIG. 2, there is illustrated a flow chart which describes the inventive method by which interference due to whistler spurs is eliminated. The flow chart is executed for each new operating RF signal frequency and calculates the value of divisors N and M for programmable dividers 123 and 133 in FIG. 1. The flow chart in FIG. 2 provides a description of the process steps which can be programmed for execution by microcomputer 170 for each new operating RF signal frequency entered from pushbutton pad 160 in FIG. 1. The coding of the process steps of the flow chart in FIG. 2 into the appropriate instructions of a suitable conventional microcomputer is a mere mechanical step for one skilled in the art. The detailed flow chart in FIG. 2 essentially provides one with the equivalent of a detailed electrical schematic, the component values of which correspond to the instructions of a selected microcomputer.

Referring to FIG. 2, the flow chart is entered at start block 202 and proceeds to block 204 where an operating RF signal frequency $F_c$ is entered into microcomputer 170 by means of pushbutton pad 160 in FIG. 1. Next, at block 206, the operating RF signal frequency $F_c$ is stored in RAM 172 in FIG. 1. RAM 172 is preferably a non-volatile memory so that entered operating RF signal frequencies are not lost when power is disconnected from the SSB receiver. It should be noted that a volatile RAM can be configured to be non-volatile by inclusion of conventional battery backup circuitry.

Proceeding to block 208, a random IF code, 0, 1 or 2, is also stored in RAM 172 in FIG. 1 together with the operating signal frequency $F_c$. The IF code determines which of three possible first IF frequencies will be selected.

Proceeding to decision block 210, a test is made to determine which IF code has been assigned. If IF code zero has been assigned, the first IF frequency is assumed to be 75.0016 mHz at block 212. If IF code one has been assigned, the first IF frequency is assumed to be 75.0048 mHz at block 214. If IF code two has been assigned, the first IF frequency assumed to be is 74.9984 mHz at block 216. The actual first IF frequency for each operating RF signal frequency varies such that the sum of the actual first IF frequency and the operating RF signal frequency is a multiple of 3200, as explained hereinabove. Next, at block 218 the frequency of variable VCO1 is calculated. Then at block 220, a quotient N and remainder R is calculated by dividing VCO1 by 3200. N is the divisor that is loaded into programmable divider 123 in FIG. 1. R varies from zero to 31 (in hundreds of Hertz) and is utilized hereinbelow to calculate the divisor M to be loaded into programmable divider 133.

Proceeding to decision block 222, the IF code is again tested. If the IF code is zero, M is set to be equal to R+9104 at block 224. If the IF code is one, M is set to be R+9072 at block 226. If the IF code is two, M is set to be equal to R+9136 at block 228. Next, at block 230, divisor N is loaded into programmable divider 123, and divisor M is loaded into programmable divider 133.

Once the divisors N and M of programmable dividers 123 and 133 have been loaded, the SSB receiver is powered up at block 232. Proceeding to decision block 234, a check is made to see if a whistler spur is present. A whistler spur can be detected by the operator of the SSB receiver or by means of detector 182 in FIG. 1. If a whistler spur is not present, the entered operating RF signal frequency $F_c$ and its assigned first IF frequency are free of whistler spurs, and NO branch is taken to return block 236, after which the next operating RF signal frequency can be entered. If a whistler spur is present, YES branch is taken to block 238 where the IF code is incremented by one. If detector 182 is not used, the program waits for the radio operator to push the IF pushbutton on pad 160 before proceeding to block 240. Next at decision block 240, a check is made to see if the IF code is greater than two. If the IF code is greater than two, YES branch is taken to block 242 where the IF code is set to zero. Otherwise NO branch is taken to block 244 where the new IF code is stored together with the previously entered operating RF signal frequency $F_c$. Next, program control returns to decision block 210, after which process steps 210 through 234 are repeated with the new IF code.

Assuming an IF code of two for the operating RF signal frequency of 2.7392 mHz discussed hereinabove, N is 24293, R is zero, and M is 9136. Therefore, the frequency of VCO 120 is 77.7376 mHz, VCO 132 is 29.2352 mHz, and the first IF is 74.9984 mHz. Assuming a 1.6 kHz whistler is produced, the IF code is incremented from two to three at block 238, and therefore set to zero at block 242. Proceeding back to block 210, N is now 24294, R is again zero, and M is 9104. Therefore, the frequency of VCO 120 is shifted by 3.2 kHz to 77.7408 mHz and VCO 132 is shifted by 3.2 kHz to 29.1329 mHz. At the new first IF frequency of 75.0016 mHz, the resultant 8 kHz whistler spur (the 1.6 kHz whistler spur having been shifted down by 9.6 kHz) is out of the 2.7 kHz passband of IF stages 108 in FIG. 1 and therefore greatly attenuated so that interference therefrom is substantially eliminated. Similarly, assuming an IF code of two for the operating RF signal frequency of 2.7393 mHz discussed hereinabove, N is 24293, R is one, and M is 9137. Therefore, the frequency of VCO 120 is 77.7376 mHz, VCO 132 is 29.2384 mHz, and the first IF is 74.9983 mHz. If a whistler spur is detected here also, the IF code is likewise set to zero at block 238, and the process is again repeated from block 210 as explained hereinabove.

In the preferred embodiment of the present invention, three IF codes were found to be adequate for eliminating interference due to whistler spurs on all RF signal frequencies at multiples of 100 Hz from 2 mHz to 30 mHz. In practicing the present invention any number of IF codes can be utilized, the practical limit being determined by the passband of IF crystal filter 104 in FIG. 1.

In summary, a unique method and apparatus has been described which can eliminate interference due to whistler spurs in snythesized SSB receivers and self quieters in synthesized FM radios. The annoying interference can be automatically detected and eliminated, or can be eliminated by pressing an IF pushbutton when the receiver operator finds the interference to be annoying to him. The present invention can be advantageously utilized in any synthesized RF signal receiver that is subject to interference from internally generated spurious signals.

We claim:
1. A radio frequency (RF) signal receiver tuned to receive an RF signal from a signal source, comprising:
first multiplying the RF signal and a first synthesizer signal to provide a first intermediate frequency (IF) signal having one of at least three pre-selected intermediate frequencies;
first filtering means having a predetermined frequency passband for filtering the first IF signal, the frequency passband of the first filtering means including the three pre-selected intermediate frequencies of the first IF signal;
second multiplying means for multiplying the filtered first IF signal from the first filtering means and a second synthesizer signal to provide a second intermediate frequency (IF) signal having a pre-selected intermediate frequency;
second filtering means having a predetermined frequency passband for filtering the second IF signal, the frequency passband of the second filtering means being less than the frequency passband of the first filtering means;
a signal source for providing a reference signal having a predetermined frequency;
first and second synthesizing means coupled to the reference signal source and responsive to first and second control signals for generating the first and second synthesizer signals, respectively;
means for generating an input signal indicating that at least one of the first and second IF signals is modulated by a spurious signal; and
control means responsive to the input signal for generating the first and second control signals for changing the frequency of the first and second synthesizer signals to produce another of the pre-selected intermediate frequencies of the first IF signal, whereby said RF signal receiver remains tuned to receive said RF signal and the spurious signal modulation is shifted outside the passband of the second filtering means.

2. The RF signal receiver according to claim 1, further including dividing means coupled to the reference signal source for frequency dividing the reference signal by a predetermined divisor, said frequency changing means changing the frequency of the first and second synthesizer signals by a pre-selected multiple of the divided reference signal.

3. The RF signal receiver according to claim 1, wherein said first and second synthesizing means each includes phase detecting means coupled to the reference signal and a feedback signal, low-pass filtering means coupled to the phase detecting means, voltage controlled oscillating means coupled to the low-pass filtering means, and dividing means coupled to voltage controlled oscillating means and further having a variable divisor; the first and second synthesizing signals being provided by the voltage controlled oscillating means of the first and second synthesizing means, respectively; and the first and second control signals changing the divisor of the dividing means of the first and second synthesizing means, respectively.

4. The RF signal receiver according to claim 1, or 3, wherein said synthesizing means includes means for selecting a multiple of the frequency of the reference signal from among N multiples, where N is an integer number greater than one.

5. The RF signal receiver according to claim 1, or 3, wherein said synthesizing means includes means for selecting the frequency of the first synthesizer signal to produce one of K frequencies of the first IF signal, where K is an integer number greater than one.

6. A method for eliminating spurious signal interference generated in a synthesized radio frequency (RF) signal receiver tuned to receive an RF signal from signal source; the RF signal receiver including first multiplying means for multiplying the RF signal and a first synthesizer signal to provide a first intermediate frequency (IF) signal, first filtering means having a predetermined frequency passband for filtering the first IF signal, second multiplying means for multiplying the filtered first IF signal from the first filtering means and a second synthesizer signal to provide a second intermediate frequency (IF) signal, second filtering means having a predetermined frequency passband for filtering the second IF signal, a signal source for providing a reference signal having a predetermined frequency, and synthesizing means coupled to the reference signal source for generating the first and second synthesizer signals, said method comprising the steps of:

producing one of at least three pre-selected intermediate frequencies of the first IF signal;

detecting that at least one of the first and second IF signals is modulated by a spurious signal;

changing, in response to detection of spurious signal modulation, the frequency of the first and second synthesizer signals to produce another of the pre-selected intermediate frequencies of the first IF signal, whereby said RF signal receiver remains tuned to receive said RF signal and the spurious signal modulation is shifted outside the passband of the second filtering means.

7. The method according to claim 6, wherein said detecting step is preceded by the step of selecting the frequency of the first synthesizer signal to produce one of N frequencies of the first IF signal, where N is an integer number greater than one.

8. The method according to claim 6 or 7, wherein said changing step includes the step of selecting a multiple of the frequency of the reference signal from among K multiples, where K is an integer number greater than one.

9. A radio frequency (RF) signal receiver tuned to receive an RF signal from a signal source, comprising:

first multiplying means for multiplying the RF signal and a first synthesizer signal to provde a first intermediate frequency (IF) signal having one of at least three pre-selected intermediate frequencies;

first filtering means having a predetermined frequency passband for filtering the first IF signal, the frequency passband of the first filtering means including the three pre-selected intermediate frequencies of the first IF signal;

second mutliplying means for multiplying the filtered first IF signal from the first filtering means and a second synthesizer signal to provide a second intermediate frequency (IF) signal having a pre-selected intermediate frequency;

second filtering means having a predetermined frequency passband for filtering the second IF signal, the frequency passband of the second filtering means being less than the frequency passband of the first filtering means;

a signal source for providing a reference signal having a predetermined frequency;

synthesizing means coupled to the reference signal source and responsive to a control signal for generating the first and second synthesizer signals;

means for demodulating the filtered second IF signal from the second filtering means;

means coupled to the demodulating means for detecting spurious signals and generating an input signal when spurious signals have been detected; and control means responsive to the input signal for generating the control signal for changing the frequency of the first and second synthesizer signals to produce another of the pre-selected intermediate frequencies of the first IF signal, whereby said RF signal receiver remains tuned to receive said RF signal and the spurious signal modulation is shifted outside the passband of the second filtering means.

10. A radio frequency (RF) signal receiver tuned to receive an RF signal from a signal source, comprising:

first multiplying means for multiplying the RF signal and a first synthesizer signal to provide a first intermediate frequency (IF) signal having one of at least two pre-selected intermediate frequencies;

first filtering means having a predetermined frequency passband for filtering the first IF signal, the frequency passband of the first filtering means including the two pre-selected intermediate frequencies of the first IF signal;

second multiplying means for multiplying the filtered first IF signal from the first filtering means and a second synthesizer signal to provide a second intermediate frequency (IF) signal having a pre-selected intermediate frequency;

second filtering means having a predetermined frequency passband for filtering the second IF signal, the frequency passband of the second filtering means being less than the frequency passband of the first filtering means;

a signal source for providing a reference signal having a predetermined frequency;

first and second synthesizing means coupled to the reference signal source and responsive to first and second control signals for generating the first and second synthesizer signals, respectively;

means for generating an input signal indicating that at least one of the first and second IF signals is modulated by a spurious signal; and control means responsive to the input signal for generating the first and second control signals for changing the frequency of the first and second synethesizer signals to produce another of the pre-selected intermediate frequencies of the first IF signal, whereby said RF signal receiver remains tuned to receive said RF signal and the spurious signal modulation is shifted outside the passband of the second filtering means.

11. A radio frequency (RF) signal receiver tuned to receive an RF signal from a signal source, comprising:

first multiplying means for multiplying the RF signal and a first synthesizer signal to provide a first intermediate frequency (IF) signal having one of at least two pre-selected intermediate frequencies;

first filtering means having a predetermined frequency passband for filtering the first IF signal, the frequency passband of the first filtering means including the two pre-selected intermediate frequencies of the first IF signal;

second multiplying means for multiplying the filtered first IF signal from the first filtering means and a second synthesizer signal to provide a second intermediate frequency (IF) signal having a pre-selected intermediate frequency;

second filtering means having a predetermined frequency passband for filtering the second IF signal, the frequency passband of the second filtering means being less than the frequency passband of the first filtering means;

a signal source for providing a reference signal having a predetermined frequency;

synthesizing means coupled to the reference signal source and responsive to a control signal for generating the first and second synthesizer signals;

means for demodulating the filtered second IF signal from the second filtering means;

means coupled to the demodulating means for detecting spurious signals and generating an input signal when spurious signals have been detected; and control means responsive to the input signal for generating the control signal for changing the frequency of the first and second synthesizer signals to produce another of the pre-selected intermediate frequencies of the first IF signal, whereby said RF signal receiver remains tuned to receive said RF signal and the spurious signal modulation is shifted outside the passband of the second filtering means.

12. A method for eliminating spurious signal interference generated in a synthesized radio frequency (RF) signal receiver tuned to receive an RF signal from a signal source; the RF signal receiver including first multiplying means for multiplying the RF signal and a first synthesizer signal to provide a first intermediate frequency (IF) signal, first filtering means having a predetermined frequency passband for filtering the first IF signal, second multiplying means for multiplying the filtered first IF signal from the first filtering means and a second synthesizer signal to provide a second intermediate frequency (IF) signal, second filtering means having a predetermined frequency passband for filtering the second IF signal, a signal source for providing a reference signal having a predetermined frequency, and synthesizing means coupled to the reference signal source for generating the first and second synthesizer signals; said method comprising the steps of:

producing one of at least two pre-selected intermediate frequencies of the first IF signal;

detecting that at least one of the first and second IF signals is modulated by a spurious signal;

changing, in response to detection of spurious signal modulation, the frequency of the first and second synthesizer signals to produce another of the pre-selected intermediate frequencies of the first IF signal, whereby said RF signal receiver remains tuned to receive said RF signal and the spurious signal modulation is shifted outside the passband of the second filtering means.

* * * * *

UNITED STATES PATENT AND TRADEMARK OFFICE
CERTIFICATE OF CORRECTION

PATENT NO. : 4,545,072
DATED : Oct. 1, 1985
INVENTOR(S) : Frank R. Skutta, et al.

It is certified that error appears in the above-identified patent and that said Letters Patent is hereby corrected as shown below:

In Column 7, line 58, after the word "multiplying" insert the words --means for multiplying--.

In Column 9, line 33, change "provde" to --provide--.

Signed and Sealed this

Eighth Day of April 1986

[SEAL]

Attest:

DONALD J. QUIGG

Attesting Officer

Commissioner of Patents and Trademarks